United States Patent
Andrews

(10) Patent No.: US 10,892,729 B2
(45) Date of Patent: Jan. 12, 2021

(54) PASSIVE NON-FERROMAGNETIC CIRCULATOR

(71) Applicant: MISSION MICROWAVE COMPONENTS LLC, Escondido, CA (US)

(72) Inventor: Michael Scott Andrews, Escondido, CA (US)

(73) Assignee: Mission Microwave Components LLC, Escondido, CA (US)

( * ) Notice: Subject to any disclaimer, the term of this patent is extended or adjusted under 35 U.S.C. 154(b) by 0 days.

(21) Appl. No.: 16/492,078

(22) PCT Filed: Mar. 7, 2018

(86) PCT No.: PCT/US2018/021403
§ 371 (c)(1),
(2) Date: Sep. 6, 2019

(87) PCT Pub. No.: WO2018/165337
PCT Pub. Date: Sep. 13, 2018

(65) Prior Publication Data
US 2020/0106414 A1    Apr. 2, 2020

Related U.S. Application Data

(60) Provisional application No. 62/469,785, filed on Mar. 10, 2017.

(51) Int. Cl.
*H03H 7/52* (2006.01)
*H01P 1/32* (2006.01)

(52) U.S. Cl.
CPC ............... *H03H 7/52* (2013.01); *H01P 1/32* (2013.01)

(58) Field of Classification Search
CPC ..... H03H 7/52; H01P 1/38; H01P 1/32; H01P 1/383; H01P 1/36; H01P 1/365; H01P 1/375; H03F 1/52; H03F 3/60; H04B 1/56; H04B 1/525
See application file for complete search history.

(56) References Cited

U.S. PATENT DOCUMENTS

| 4,635,005 A * | 1/1987 | Kaminsky | H03F 3/60 |
| | | | 333/170 |
| 2006/0087376 A1 | 4/2006 | Young et al. | |
| 2007/0096842 A1 | 5/2007 | Hyun et al. | |
| 2009/0309671 A1 | 12/2009 | Adams et al. | |
| 2019/0372190 A1 * | 12/2019 | Kord | H03H 7/52 |

OTHER PUBLICATIONS

International Search Report and Written Opinion dated May 30, 2018 International Application No. PCT/US2018/021403, filed Mar. 7, 2018.

* cited by examiner

*Primary Examiner* — Stephen E. Jones
(74) *Attorney, Agent, or Firm* — Knobbe, Martens, Olson & Bear, LLP

(57) ABSTRACT

A non-ferromagnetic electronic circulator device and system is described. Such passive electronic circulator devices may include a plurality of ports that include a discrete arrangement of resistors, capacitors and inductors that form a fully connected S parameter matrix. Signals that enter a first port of the circulator only exit from the second port, signals entering the second port only exit from the third port, signals entering the third port only exit the fourth port, and signals entering the fourth port, only exit the first port.

16 Claims, 5 Drawing Sheets

PASSIVE NON-FERROMAGNETIC CIRCULATOR

INCORPORATION BY REFERENCE TO ANY PRIORITY APPLICATIONS

This application is a U.S. National Phase Application of International Application No.: PCT/US2018/021403 filed on Mar. 7, 2018, which claims priority to U.S. Provisional Patent Application No. 62/469,785 filed on Mar. 10, 2017. The entireties of these applications are hereby incorporated by reference for all purposes. Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The present disclosure relates to electronic circulator devices and systems which incorporate such devices. More specifically, the disclosure relates to passive electronic circulators that are non-ferromagnetic.

Description of the Related Art

A circulator is a radio communications device that is used to isolate incoming from outgoing radio wave energy. A common application is in the placement between an antenna and various final stage amplifiers within a radio equipment signal path. Since the first appearance of the circulator, the device has been fabricated as a hybrid; a combination of waveguide and printed circuits, with the use of a magnetic material inside the waveguide portion of a circulator cavity. This design provides the directional propagation of electromagnetic propagating waves in the right-handed orientation they normally follow. The particular geometry of the magnetic material, along with the circuit design, determine the bandwidth response.

More recently active circulators have been described which compose of a ring of transistor amplifiers with a series of connections that cause a similar right-handed traversal of wave energy and thereby create the essence of the circulator function. However, these types of devices have drawbacks due to the difficultly in their design and that they cannot ensure isolation of each device connected to the circulator, possibly damaging the connected active devices.

Circulators are typically used in RF transmission line applications, and includes three ports. This type of circulator is known as a Y-junction circulator. When a signal is sent to the first port, the signal will only thereafter be accessible exiting the second port in sequence, meaning the next port immediately adjacent the first port. Generally, the signal is generally attenuated and therefore is not available at the third port in the sequence. However, if a signal is directed into the second port, it will be available exiting the third port, which is immediately adjacent the second port, but will not be available at the first port. If a signal is introduced at the third port, it will be available exiting the first port, but not exiting the second port. Thus, a circulator device can propagates signals from one adjacent port to the next port sequentially and circularly around the multiple ports. The signal circulation may be right-handed whereby the signal moves around the circulator clockwise, or left-handed where the signal moves around the circulator counter-clockwise.

SUMMARY OF THE INVENTION

In the present disclosure a novel circulator device is described which provides a non-reciprocal electromagnetic signal transport without the use of ferromagnetic materials and that may be realized in integrated and printed circuits on substrate materials with simple coupling structures.

One embodiment is a non-magnetic, passive quadrupole circulator device. This embodiment includes a first port, a second port, a third port, and a fourth port; and a discrete arrangement of resistors, capacitors and inductors that form a fully connected S parameter matrix, wherein signals entering the first port only exit from the second port, signals entering the second port only exit from the third port, signals entering the third port only exit the fourth port, and signals entering the fourth port, only exit the first port.

These and other features of this disclosure will become more fully apparent from the following description.

BRIEF DESCRIPTION OF THE DRAWINGS

The disclosed aspects will hereinafter be described in conjunction with the appended drawings, provided to illustrate and not to limit the disclosed aspects, wherein like designations denote like elements.

DETAILED DESCRIPTION

Figure 1B:
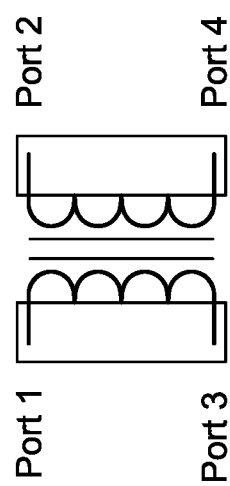
FIG. 1B is a schematic drawing of a prior art circuit of a type of quadrupole—a four-port circulator, that includes a central magnet.

In order to meet the need of radio compatibility in an increasingly dense radio spectrum, embodiments of the invention include a new type of circulator element that combines the best of passive and active designs. Embodiments do not depend on magnetics and are therefore less susceptible to damage, can offer more bandwidth, can be tuned in-circuit, and can be made compact enough for incorporation onto integrated circuits formed on crystals or thin-film printed circuits formed on a wide variety of composites, ceramics or metamaterials.

It is to be understood that the present subject matter is not limited in its application to the details of construction and to the arrangements of the components set forth in the following description or illustrated in the drawings pertaining thereto. The present subject matter is capable of other embodiments and of being practiced and carried out in various ways. Also, it is to be understood that the phraseology and terminology employed herein are for the purpose of description and should not be regarded as limiting.

Reference now will be made in detail to the several embodiments of the present subject matter. Such embodiments are provided by way of explanation of the present subject matter, which is not intended to be limited thereto. Various modifications and variations can be made to both design approach and to resulting topology once the technique and result described herein is fully appreciated by one ordinarily skilled in the art.

For example, features illustrated or described as part of one embodiment can be used on other embodiments to yield a still further embodiment. Additionally, certain features may be interchanged with similar devices or features not mentioned yet which perform the same or similar functions. It is therefore intended that such modifications and variations are included within the totality of the present subject matter.

Figure 1A:
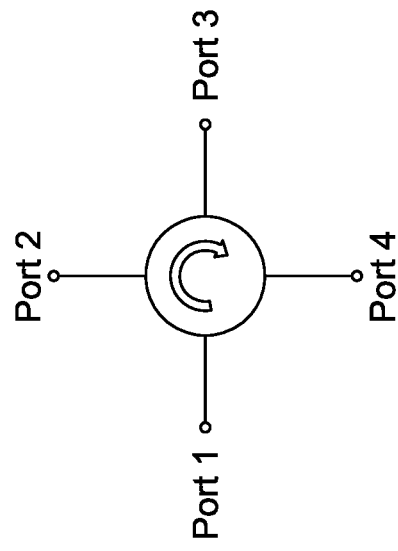
FIG. 1A is a schematic drawing that illustrates a prior art basic transformer device with two wound wires or inductors in close proximity to each other.

FIG. 1(a) illustrates a prior art basic transformer device whereby two wound wires or inductors (also referred to as coils) are in close proximity to each other, usually in a parallel arrangement with respect to their long axes. Such a device may be classified as belonging to a larger group of devices referred to as quadrupoles, which means having four poles, ports or terminals. The action of this particular quadrupole is such that an electrical current flowing between left-hand ports (Port 1 and Port 3) will induce or influence an electrical current between the right-hand ports (Port 2 and Port 4). This action is called mutual inductance or may also be referred to as mutual coupling to indicate that there is energy transfer with said transfer by an influence means rather than by a direct means.

Through the action of this mutual inductance, left-hand ports are said to be isolated to right-hand ports due to mutual inductance or coupling between them, whereby one part of the transformer circuit is influenced by the other and vice versa rather than being directly connected to each other, hence the term "isolation transformer" is often used interchangeably to refer to the transformer. A basic transformer may be realized in a number of ways, including using mutual wound wire in close proximity to each other. A transformer may also be realized with planar transmission lines that are close to each other and in parallel with each other. A transformer can also arise by using spiral shapes of metal where one is positioned on top of another. Transformers may utilize a dielectric or core material (indicated by two vertical bars between the inductors) to separate said inductors from each other. Such a dielectric may be constructed from any material, although the most common material is ferrous (iron-based), but may also be as simple is air.

FIG. 1(b) shows a circuit symbol for another type of quadrupole—a four-port circulator. This circuit as shown is constructed using some form of closed circular circuit path or loop and a central magnet to provide a right-handed (or clockwise) direction of energy transport from one port to the next. The circuit behavior of such a device is referred to as non-reciprocal because the energy transport proceeds in only one direction and not in the opposite direction. This allows a circulator to provide an amount of isolation between non-commuting ports.

One embodiment of the invention is passive circulator that does not require a central magnet, but still provides the advantages of ferros-based devices. One way to describe this embodiment is using a mathematical description to describe the interactions of the quadrupoles as shown in FIG. 1B. Circuit topologies pertaining to operation at radio, microwave or millimeter wave frequencies or beyond are usually succinctly characterized through their "S Parameter" descriptions.

Scattering parameters or S-parameters (the elements of a scattering matrix or S-matrix) describe the electrical behavior of linear electrical networks when undergoing various steady state stimuli by electrical signals. The parameters are useful for several branches of electrical engineering, including electronics, communication systems design, and especially for microwave engineering.

The S-parameters are members of a family of similar parameters, other examples being: Y-parameters, Z-parameters, H-parameters, T-parameters or ABCD-parameters. S-parameters differ from these other parameters in the sense that S-parameters do not use open or short circuit conditions to characterize a linear electrical network; instead, matched loads are used. These terminations are easier to use at high signal frequencies than open-circuit and short-circuit terminations. Moreover, the quantities of S-parameters are measured in terms of power.

Many electrical properties of networks of components, such as inductors, capacitors, and resistors may be expressed using S-parameters. Examples of such S-parameters include gain, return loss, voltage standing wave ratio (VSWR), reflection coefficient and amplifier stability. The term 'scattering' is more common to optical engineering than RF engineering, referring to the effect observed when a plane electromagnetic wave is incident on an obstruction or passes across dissimilar dielectric media. In the context of S-parameters, scattering refers to the way in which the traveling currents and voltages in a transmission line are affected when they meet a discontinuity caused by the insertion of a network into the transmission line. This can be thought of as equivalent to the wave meeting an impedance differing from the line's characteristic impedance. Characteristic impedance refers to the inherent impedance of any circuit.

Although applicable at any frequency, S-parameters are mostly used for evaluating networks operating at radio frequency (RF) and microwave frequencies where signal power and energy considerations are more easily quantified than currents and voltages. S-parameters change with the measurement frequency, so frequency must be specified for any S-parameter measurements stated, in addition to the characteristic impedance or system impedance.

S-parameters are readily represented in matrix form and obey the rules of matrix algebra.

Four port S Parameters are used to characterize 4 port networks or quadrupoles. They include information regarding the reflected and incident power waves between the 4 ports of the network and thus they describe the appropriate wave interaction between each individual port pair as the waves traverse the whole circuit (the circuit response to the stimulus) represented by the quadrupole. The matrix for a general 4 Port or quadrupole would be thus represented in S Parameters as:

$$\begin{pmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{pmatrix}$$

They are commonly used to analyze a pair of coupled transmission lines to determine the amount of cross-talk between them, if they are driven by two separate single ended signals, or the reflected and incident power of a differential signal driven across them.

The specific S-Parameters for the two quadrupoles of FIG. 1A or 1B may be represented as follows. For the transformer of FIG. 1A by which the S-Parameters for the idealized circuit (constant across all frequencies is):

$S_{11}=S_{24}=S_{33}=S_{42}=N^2/(1+N^2)$ $S_{14}=S_{23}=S_{32}=S_{41}=-N/(1+N^2)$ $$S_{12}=S_{21}=S_{34}=S_{43}=N/(1+N^2)$$

$$S_{13}=S_{22}=S_{31}=S_{44}=1/(1+N^2)$$

Where N represents the number of turns in the inductor coils or the number of windings or legs of a spiral. It is an important aspect of the present subject matter to consider what happens as the number of turns approaches a large number. In this case, a very simple approximation matrix results:

$$\begin{pmatrix} 1 & 0 & 0 & 0 \\ 0 & 0 & 0 & 1 \\ 0 & 0 & 1 & 0 \\ 0 & 1 & 0 & 0 \end{pmatrix}$$

Similarly, the scattering matrix for an idealized 4-port circulator may be correspondingly expressed and is noted to be quite similar upon comparison with the matrix of the ideal transformer above. The matrix pertaining to the idealized circulator of FIG. 1B may be expressed as:

$$\begin{pmatrix} 0 & 0 & 0 & 1 \\ 1 & 0 & 0 & 0 \\ 0 & 1 & 0 & 0 \\ 0 & 0 & 1 & 0 \end{pmatrix}$$

And in further recognizing that both of these matrices are merely permutations of the 4$^{th}$ dimensional matrix identity, it is clear that through suitable transformation, one form can be converted to the other. These circuits may be said to be complimentary in quadrupole space which means that one representation can be commuted to the other through a set of suitable transformations that can be directly represented by corresponding circuits.

In the rest of this description two specific embodiments are discussed along with two methods by which the ideal transformer of FIG. 1A may be transformed into the ideal circulator of FIG. 1B. It is recognized that one ordinarily skilled in the art should similarly be able construct the reverse transformation through re-arrangement of the circuit topology described herein.

Another embodiment can use geometric metal shapes that are cross-connected to form circuits described by the discrete preferred embodiments described herein. It is also recognized that other arrangements are possible without violating the spirit of the novelty and approach of what is described herein.

For example, features illustrated or described as part of one embodiment can be used on other embodiments to yield a still further embodiment. Additionally, certain features may be interchanged with similar devices or features not mentioned yet which perform the same or similar functions. It is therefore intended that such modifications and variations are included within the totality of the present invention.

Figure 2:
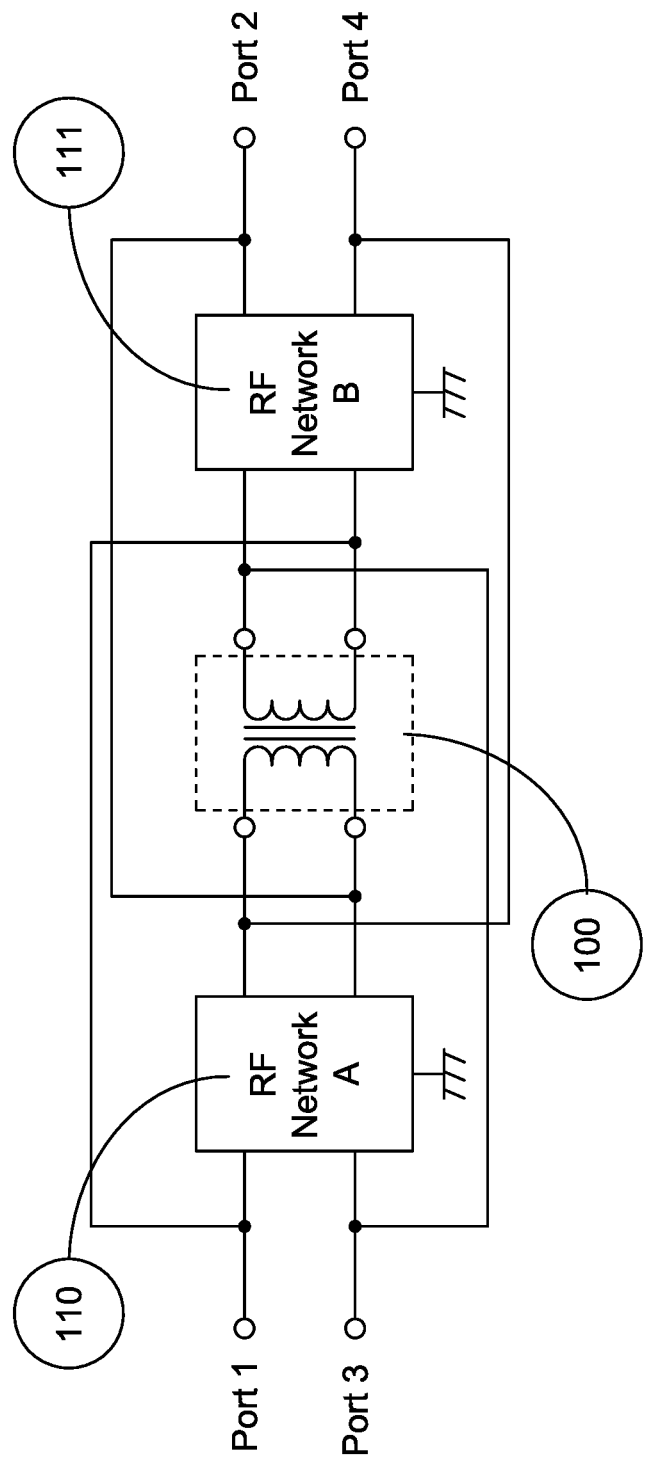
FIG. 2 is a schematic drawing of one embodiment of a basic passive quadrupole transformer according to one embodiment of the invention.

Referring to the drawings, and initially to FIG. 2, a basic quadrupole transformer 100 is shown which is desired to be transformed to a circulator function. As shown, the transformer 100 is connected to a RF Network A 110 and a RF Network B 111. These RF networks are shown to illustrate an exemplary arrangement of one embodiment in order to achieve a complete transformation to a desired circulator.

In this arrangement, the RF Network A 110 includes two transformer ports 1 and 3 are connected to form a left-side network. The RF Network B 111 similarly includes two transformer ports 2 and 4 connected to form a right-side network. In this arrangement, the RF Network A 110 is a left-side circuit network that can take many different forms. The only requirement is that this network perform the mathematical equivalent of a left-permutation on the transformer so that the input side of the transformer is correctly arranged as the input to a circulator. It will be appreciated that one ordinarily skilled in the art may construct such a network in wide a variety of ways and with a wide variety of means. In the same manner, the RF network B 111 is a right-side network that may also take many forms and is not in any way constricted by the features of the RF Network A 110 to be of a particular construction. The RF Network B 111 provides the right-permutation that causes the transformer to appear as a circulator to externally connected devices.

The connectivity shown is exemplary in that there may exist multiple other possible arrangements of connectivity to achieve a similar or identical result. It is not the intention of FIG. 2 to demonstrate all possible connectivity arrangements that may be made to achieve the desired transformation.

Figure 3:
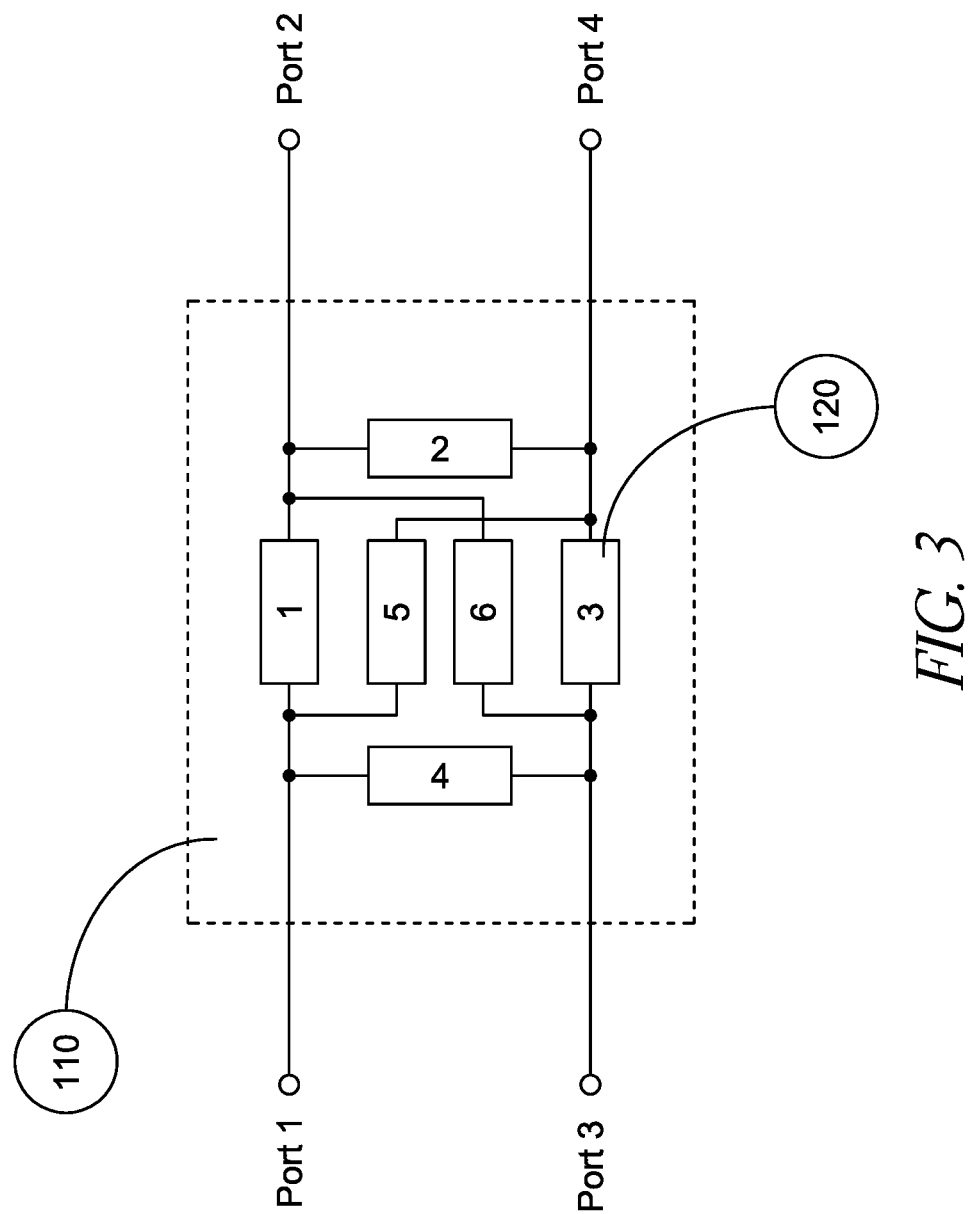
FIG. 3 is a schematic drawing of one embodiment of the elements of RF Network A from FIG. 2.

FIG. 3 shows one design of the specific sub-elements may make up the left side RF Network A 110. However it should be realized that similar sub-elements may make up the right side RF Network B 111. These sub-elements may be suitably constructed from a number of similar or disparate elements where one such circuit element 120, when connected together in such a way that causes circuital path transformation of each of the ports with another of the connected ports. Element 120, which is described more fully with reference to FIG. 5 below, may be comprised of simple wire, transmission lines, such as coaxial lines, discrete circuit elements or distributed circuit elements formed from metal geometries on dielectric substrate materials. It is not the intention of FIG. 3 to limit the possible circuital path transformations between any two ports within the RF Network A 110 or a port with itself. Many possible arrangements exist apart from the illustrated embodiment described in more detail below.

Figure 4:
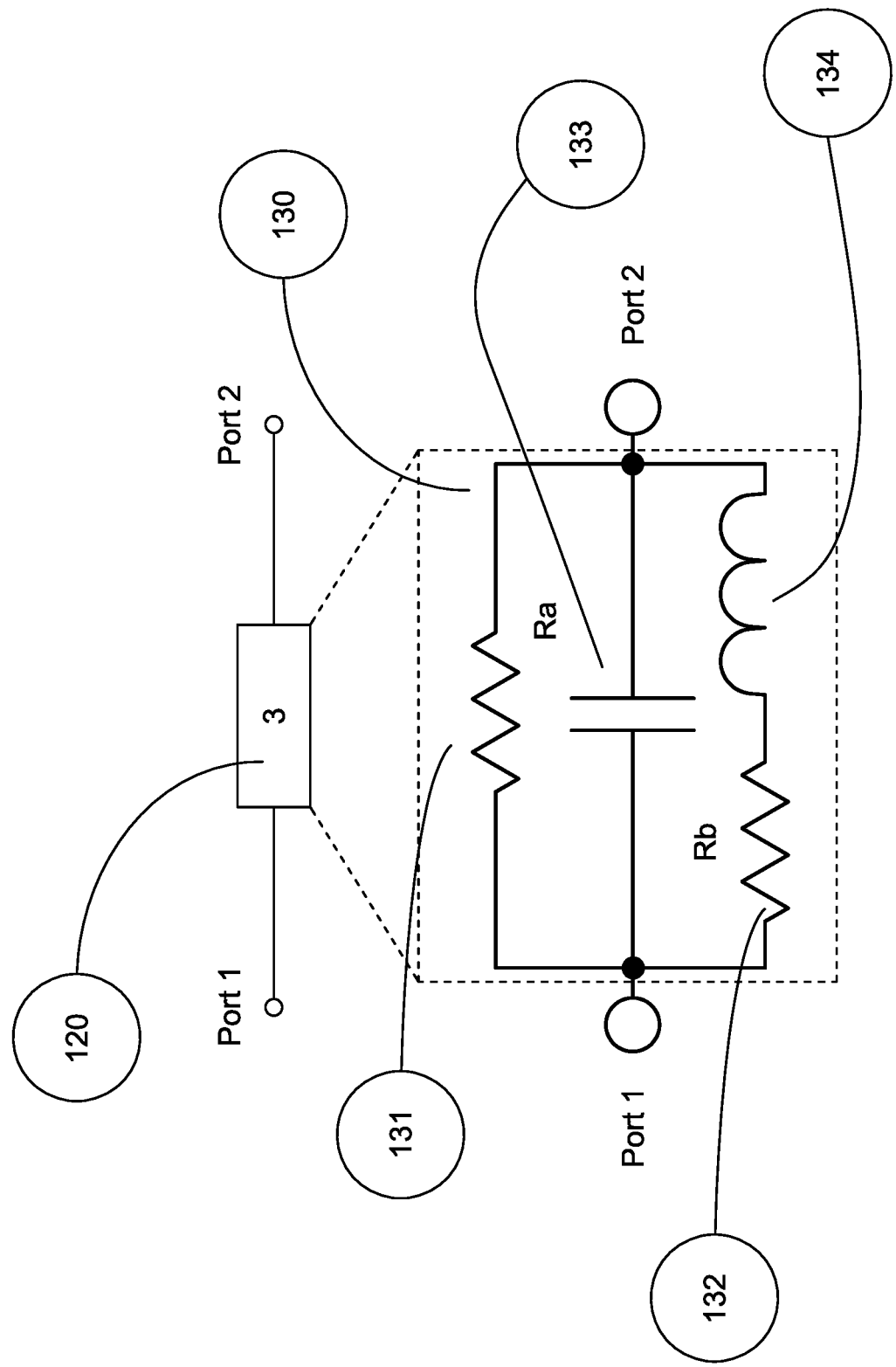
FIG. 4 is a schematic drawing of a more detailed view of the network element 120 shown in FIG. 3.

FIG. 3 shows a first element 1 which is directly connected between Port 1 and Port 2, thereby enabling a signal connection directly between these two ports. Element 2 connects Port 2 to Port 4 and enables a signal connection directly between these two ports. Element 3 connects Port 3 to Port 4 and enables a signal connection directly between these two ports. Element 4 connects Port 1 to Port 3 and enables a signal connection directly between these two ports. Element 5 connects Port 1 to Port 4 and enables a signal connection directly between these two ports. Element 6 connects Port 2 to Port 3 and enables a signal connection directly between these two ports. Taken together, Elements 1 to 6 form a fully connected network for the quadrupole network. These elements are in a suitable arrangement to provide a left-permutation or right-permutation of RF Network A 110 or RF Network B 111 referenced in FIG. 2. Exemplary electronic elements which may make the sub-components of any of the Elements 1-6 of FIG. 3, are shown in FIG. 4. It should be realized that the schematic diagram of FIG. 4 is not the only embodiments of each element, and other similar configurations of circuit components may also be included within embodiments of the invention.

Referring to FIG. 4, the network element 120 of FIG. 3 may be further detailed by an exemplary RLCG type circuit manifested by a sub-element 130 which is known to those of ordinary skill in the art. Sub-element 130, in this embodiment, includes four discrete circuit elements that function together to form the RLCG type circuit. As shown, the sub-element 130 includes a first resistor $R_a$ 131 connected between port 1 and port 2. Sub-element 130 also includes a second resistor, Rb 132 connected between port 1 and port 2 and in a parallel configuration with the first resistor $R_a$ 131. A discrete capacitor 133 is also connected between ports 1 and 2 and also in a parallel configuration with the first resistor $R_a$ 131 and the second resistor Rb 132. A discrete inductor 134 is connected between port 1 and port 2 and in series with the second resistor Rb 132.

It will be appreciated by one of ordinary skill in the art that this exemplary circuit arrangement may be designed specified as the required values of said first resistor 131, second resistor 132, capacitor 133, and inductor 134 that affect the desired left-permutation provided through the RF Network A 110 of FIG. 2. It will be realized that these values for these sub-elements will be, in general, different among all of the network elements 120 for FIG. 3 through a wide variety of methods and means. Calculation of these resistor, capacitor and inductor values may be made to achieve the previously mentioned S-parameters It will be further appreciated by one of ordinary skill in the art that some of the values used in the first resistor 131, second resistor 132, capacitor 133, and inductor 134 may not be fixed over time but may be time varying and/or frequency dependent and may furthermore be controlled as such. It will be further appreciated by one of ordinary skill in the art that this circuit arrangement may lend itself well to implementation via use of integrated circuit topologies for discrete lumped element design and transmission line topologies for distributed design.

Figure 5:
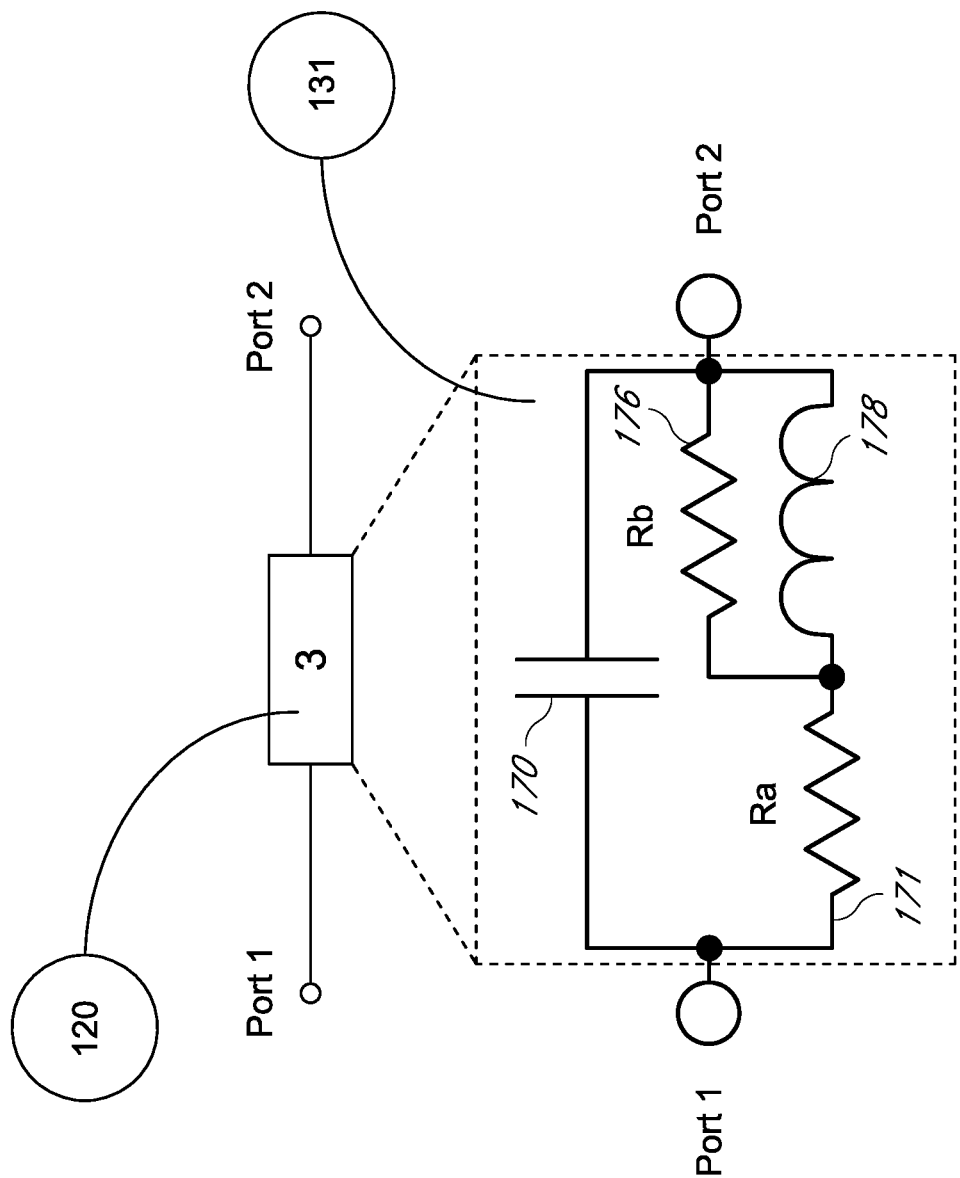
FIG. 5 is a schematic drawing of an alternate element 120 as shown in FIG. 3.

Referring to FIG. 5, an alternate embodiment of the element 120 of FIG. 3 is shown by reference to the sub-component 131. In this configuration of an alternate RLCG circuit, there is a first capacitor 170 that connects port 1 to port 2. As shown a resistor Ra 171 also connects port 1 to port 2 in a parallel configuration to the first capacitor. A second capacitor Rb 176 is shown as in series with the first capacitor C. An inductor L 178 is shown in a parallel configuration with the second resistor Rb and in series with the first resistor Ra. Without unduly constraining the novelty disclosed herein, a possible solution for one sub-component 131 for the resistor Ra 171 is found to be 168 Ohms, and for resistor Rb 176 is found to be 140 Ohms, and capacitor C 170 is found to be 1.5 femtoFarad with inductor L 178 of value 0.2 nanoHenries. This component selection provides a partial solution to a complete exemplary transformation circuit operating at 1 GHz in the radio spectrum.

Many other such circuit arrangements are possible which may satisfy the requisite transformation of RF Networks 110 or 111 of FIG. 2, for example, as one or ordinary skill in the art will appreciate, RF Network A 110 and/or RF Network B 111 could be designed and implemented as a general filter structure as long as the effect of the left-permutation through a left-filter and right-permutation through a right-filter appearing to the transformer quadrupole are properly included in the design and realization of such a circuit. The filters could be any type of filter, including a fixed response, time-varying, or frequency dependent filter.

It is not the intention of the exemplary preferred embodiment to limit the possible circuital arrangements that may be constructed to affect the said requisite transformation to transform said transformer device into said circulator device in quadrupole space. Nor is it the intention of the present subject matter and expression of novelty to limit the possible transformations between other similarly expressed devices whether they are quadrupole (consisting of exactly 4 ports) or comprised of some other number of poles neither from disparate devices with an incommensurate number of poles. The present subject matter and expression of novelty seeks to broadly scope and encompass a myriad of circuits that may be achieved with the utility of technique described by the preferred embodiment described here.

Implementations disclosed herein provide systems and methods for circulator systems. One skilled in the art will recognize that these embodiments may be implemented in hardware, software, firmware, or any combination thereof.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

As used herein, the term "plurality" denotes two or more. For example, a plurality of components indicates two or more components. The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like. The phrase "based on" does not mean "based only on," unless expressly specified otherwise. In other words, the phrase "based on" describes both "based only on" and "based at least on."

In the foregoing description, specific details are given to provide a thorough understanding of the examples. However, it will be understood by one of ordinary skill in the art that the examples may be practiced without these specific details. For example, electrical components/devices may be shown in block diagrams in order not to obscure the examples in unnecessary detail. In other instances, such components, other structures and techniques may be shown in detail to further explain the examples.

It is also noted that the examples may be described as a process, which is depicted as a flowchart, a flow diagram, a finite state diagram, a structure diagram, or a block diagram. Although a flowchart may describe the operations as a sequential process, many of the operations can be performed in parallel, or concurrently, and the process can be repeated. In addition, the order of the operations may be re-arranged. A process is terminated when its operations are completed. A process may correspond to a method, a function, a procedure, a subroutine, a subprogram, etc. When a process corresponds to a software function, its termination corresponds to a return of the function to the calling function or the main function.

The previous description of the disclosed implementations is provided to enable any person skilled in the art to make or use the present invention. Various modifications to these implementations will be readily apparent to those skilled in the art, and the generic principles defined herein may be applied to other implementations without departing from the spirit or scope of the invention. Thus, the present invention is not intended to be limited to the implementations shown herein but is to be accorded the widest scope consistent with the principles and novel features disclosed herein.

What is claimed is:

1. A non-magnetic, passive quadrupole circulator device, comprising:
   a first port, a second port, a third port, and a fourth port; and
   a discrete arrangement of resistors, capacitors and inductors that form a fully connected S parameter matrix, wherein signals entering the first port only exit from the second port, signals entering the second port only exit from the third port, signals entering the third port only exit the fourth port, and signals entering the fourth port, only exit the first port.

2. The device of claim 1, wherein the device is configured to transmit radio, microwave or millimeter wave signals.

3. The device of claim 1, wherein the discrete arrangement results in a circulator device that is fixed, time-varying or frequency dependent.

4. The device of claim 1, wherein the signals move around the circulator clockwise.

5. The device of claim 1, wherein the signals move around the circulator counter-clockwise.

6. The device of claim 1, wherein port 1 is connected to port 2 through an RLCG type circuit.

7. The device of claim 6, wherein the RLCG type circuit comprises a first resistor, a second resistor, a discrete capacitor and a discrete inductor.

8. The device of claim 7, wherein the first resistor is in a parallel connected arrangement with the discrete capacitor.

9. The device of claim 8, wherein the discrete capacitor is in a parallel connected arrangement with the second resistor.

10. The device of claim 9, wherein the second resister is in a series connected arrangement with the discrete inductor.

11. The device of claim 1, comprising four discrete circuit elements that function together to form the RLCG type circuit.

12. The device of claim 11, wherein a first of the discrete circuit elements comprises a first resistor, a second resistor, a discrete capacitor and a discrete inductor.

13. The device of claim 12, wherein the first resistor is in a parallel connected arrangement with the discrete capacitor.

14. The device of claim 13, wherein the discrete capacitor is in a parallel connected arrangement with the second resistor and the discrete inductor.

15. The device of claim 1, wherein the passive quadrupole circulator device comprises a left-filter and a right-filter.

16. The device of claim 15, wherein the left-filter or right-filter is a fixed response, time-varying, or frequency dependent filter.

* * * * *